United States Patent
Wang et al.

(10) Patent No.: US 7,079,399 B2
(45) Date of Patent: Jul. 18, 2006

(54) PRINTED CIRCUIT BOARDS HAVING IMPROVED SOLDER PADS

(75) Inventors: Ping Wang, Shenzhen (CN); Yan-Fang Li, Shenzhen (CN)

(73) Assignee: HON HAI Precision Industry Co., Ltd., Tu-cheng (TW)

( * ) Notice: Subject to any disclaimer, the term of this patent is extended or adjusted under 35 U.S.C. 154(b) by 0 days.

(21) Appl. No.: 11/027,215

(22) Filed: Dec. 29, 2004

(65) Prior Publication Data

US 2005/0282415 A1    Dec. 22, 2005

(30) Foreign Application Priority Data

Jun. 21, 2004   (CN) .................... 2004 1 0027844

(51) Int. Cl.
*H05K 7/06*   (2006.01)
(52) U.S. Cl. .................................... 361/777
(58) Field of Classification Search ............... 439/83; 361/777, 767–768; 174/261, 266
See application file for complete search history.

(56) References Cited

U.S. PATENT DOCUMENTS

| 5,000,691 A | 3/1991 | Olsson et al. .................. 439/83 |
| 5,092,035 A | 3/1992 | McMichen et al. ............ 29/845 |
| 5,784,262 A * | 7/1998 | Sherman ...................... 361/777 |

* cited by examiner

*Primary Examiner*—Javaid H. Nasri
(74) *Attorney, Agent, or Firm*—Tim Tingkang Xia, Esq.; Morris, Manning & Martin

(57) ABSTRACT

A printed circuit board having improved solder pads for preventing from short circuit of the printed circuit board caused by axial leads (30, 31) of components engaging the circuit surrounding the soldering pad comprises a pair of through holes (10, 11), a pair of first pads (20, 21) surrounding corresponding through holes and a pair of second pads (40, 41) adjacent corresponding first pads. When components are inserted into the through holes of the printed circuit board using placement machines, bent portions of the axial leads that are extended out of the first pads will fall into the second pads.

16 Claims, 4 Drawing Sheets

PRINTED CIRCUIT BOARDS HAVING IMPROVED SOLDER PADS

BACKGROUND OF THE INVENTION

1. Field of the Invention

The present invention relates to a printed circuit board, and particularly to a printed circuit board which has improved solder pads layout.

2. Description of Related Art

Conventional printed circuit boards each define a plurality of through holes. The through holes are provided for extension of leads of components. The components are connected with the printed circuit board with the leads soldered thereto. A solder pad area is provided around each through hole when layout. Circuit is not laid in the pad areas and the pad areas are commonly covered with solder. The components are attached to the printed circuit board by wave soldering or reflow soldering. The pad areas are for preventing short circuit between the components and the circuit around the components on the printed circuit board.

Bigger components with axial leads are typically inserted into the printed circuit board manually. This insertion process is unduly laborious and time-consuming and has a low efficiency. An improved method of inserting components to corresponding through holes of the printed circuit board by placement machines is provided. This operation can greatly increase the efficiency.

The axial leads of the components should be perpendicular to the printed circuit board. But the axial leads are often bent when the components are inserted into the through holes by machine. The bent angles are different according to different placement machine. FIGS. 5 to 8 show four kinds of commonly bent angles respectively. Through holes 10' and 11' of the printed circuit board provide a component (not shown) with two axial leads to extend therethrough. The through holes 10' and 11' are surrounded by solder pads 20' and 21', respectively. Numbers 30' and 31' indicate two axial leads of the components. Letters a1, a2, b1 and b2 respectively indicate the angles of that the axial lead 30' and the axial lead 21' away from the through hole 10' and through hole 11'. The placement machine determines the values of a1, a2, b1 and b2. Usually, a1=a2=45 degrees, b1=b2=45 degrees. Commonly, only one of these bent angles will happen when one kind of placement machine is used to insert the components. When the axial lead of the component is out of the area of the soldering pad, it is prone to touch the circuit that surrounds the soldering pad. Thus a short circuit in the printed circuit board occurs and this causes damage to the printed circuit board.

An improved printed circuit board that overcomes the above-mentioned problems is desired.

SUMMARY OF THE INVENTION

An object of the present invention is to provide a printed circuit board that has improved solder pad layout for preventing short circuit of the printed circuit board.

In order to achieve the above object, a printed circuit board having improved solder pads in accordance with a preferred embodiment of the present invention for preventing from short circuit of the printed circuit board caused by axial leads of components engaging the circuit surrounding the soldering pad comprises a pair of through holes, a pair of first pads surrounding corresponding through holes and a pair of second pads adjacent corresponding first pads. When components are inserted into the through holes of the printed circuit board using placement machines, bent portions of the axial leads that are extended out of the first pads will fall into the second pads.

Other objects, advantages and novel features of the present invention will become more apparent from the following detailed description when taken in conjunction with the accompanying drawings, in which:

DESCRIPTION OF THE INVENTION

Figure 1:
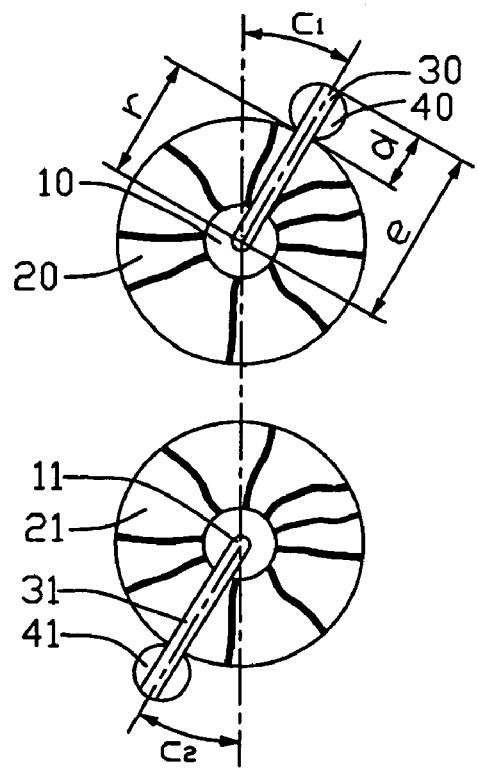
FIGS. 1 to 4 are schematic views of four kinds of solder pads in accordance with a preferred embodiment of the present invention.

FIGS. 1 to 4 illustrate a pair of solder pads in accordance wit the present invention. A pair of plated through holes 10, 12 which may be arranged in a row is provided to receive conventional components such as a resistor which has axial leads 30, 31 formed therefrom to project through holes 10, 12. The components are electrically and physically connected to the printed circuit board by passing the entire printed circuit board through a wave soldering operation. A pair of first pads 20, 21 are located on a same surface of the printed circuit board and respectively around the through holes 10, 11. The first pads 20,21 are covered with solder. A pair of second pads 40,41 are circular and covered with the same solder of the first pads 20,21. A plurality solder pads such as the first pads 20,21 and the second pads 40, 41 is disposed on the printed circuit board. There are no connecting traces (or signal lines) passing between the first pads 20,21 and the second pads 40,41 for preventing from short circuit between the neighboring pads 20,40. The second pad 40 and the first pad 20 are two tangent circles. The second pad 41 and the first pad 21 are two tangent circles.

The improvement point of this invention is to add the second pads 40, 41 around the first pads 20, 21. When the components are inserted into the printed circuit board using a placement machine, the bent portions of the axial leads 30, 31 that are extended out of the areas of the first pads 20, 21 can fall into the area of the second pads 40, 41. Therefore, the axial leads 30, 31 are prevented from engaging the circuit around the first pads 20, 21 thereby avoiding short circuit of the printed circuit board.

Figure 2:
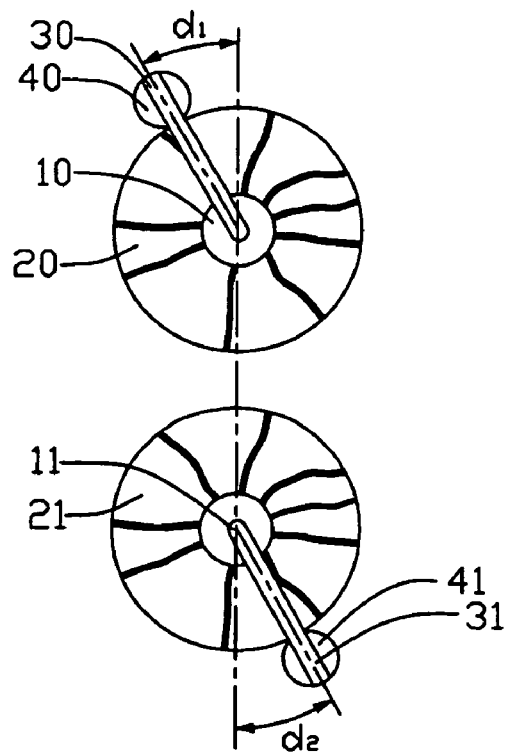
Figure 3:
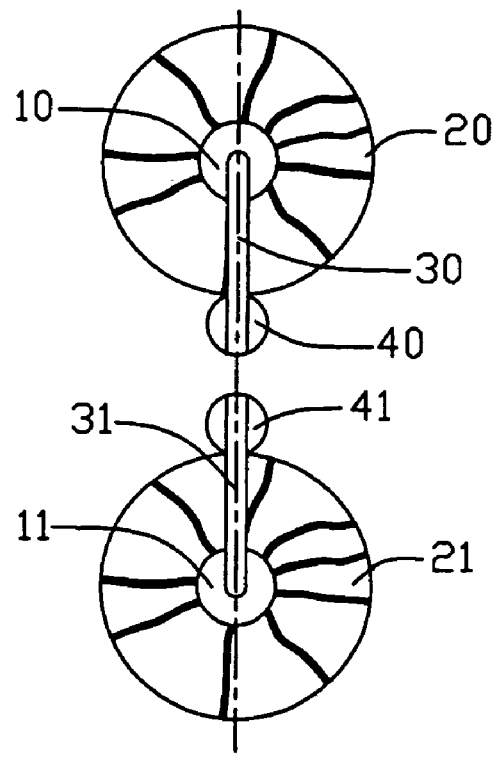
Figure 4:
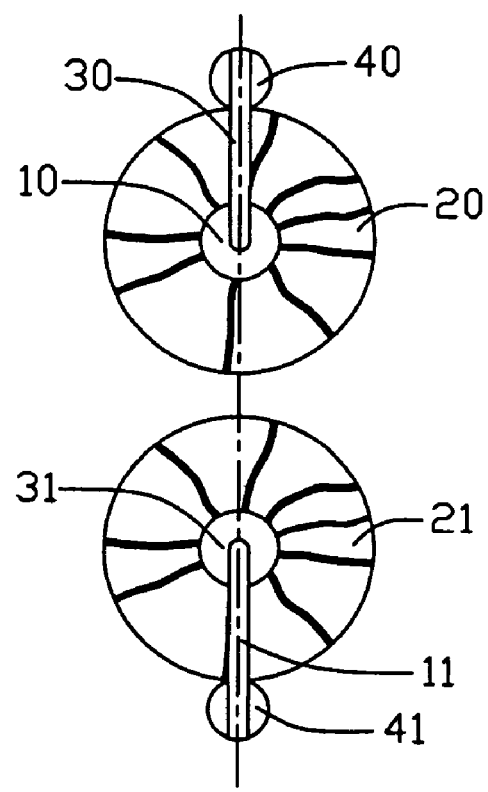
Figure 5:
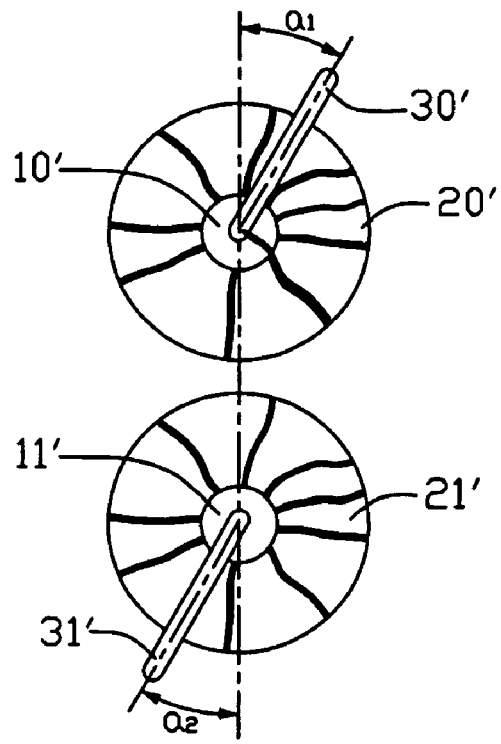
FIGS. 5 to 8 are schematic views of four kinds of bending cases when using conventional solder pads.
Figure 6:
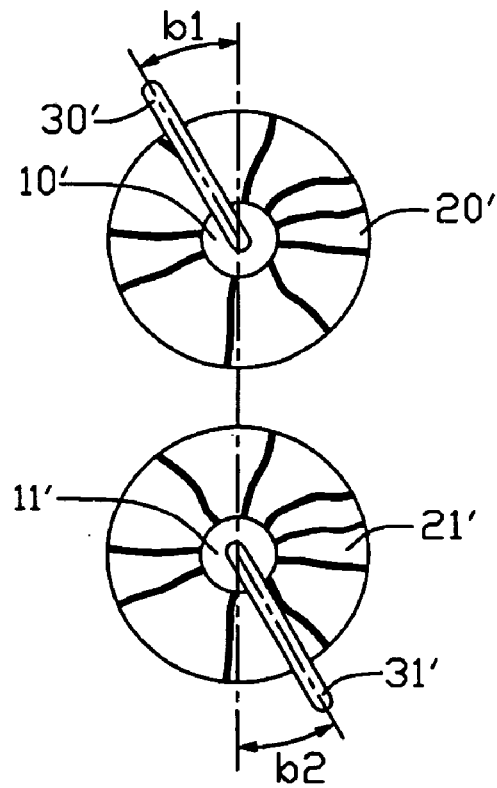
Figure 7:
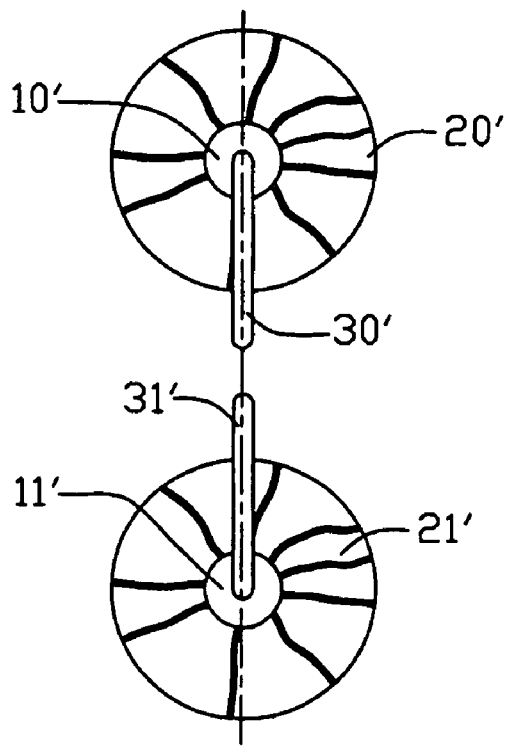
Figure 8:
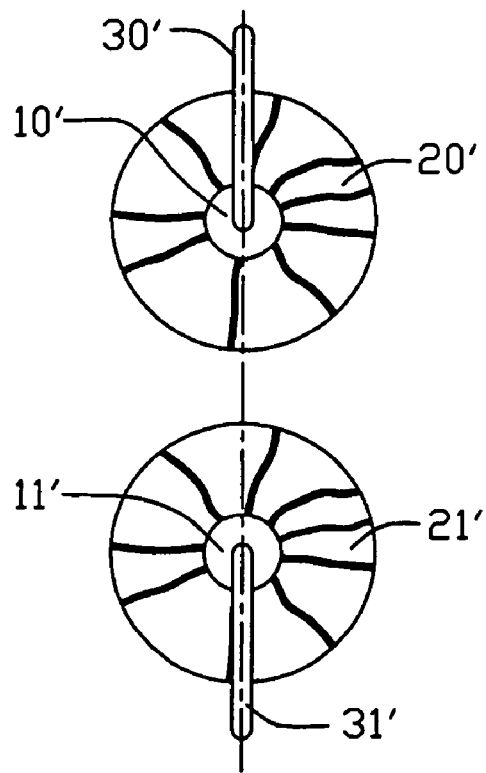

Commonly, only one kind of bent angle will happen when one kind of placement machine is used to insert the components. FIGS. 1 to 4 show four kinds of layouts of second pads 40,41 according to the four kinds of commonly bent angles of the axial leads 30, 31. Referring to FIGS. 1 and 2, the axial leads 30,31 are bent away from area of the first pads 20, 21. Bent angles c1, c2 or d1, d2 are formed between the axial leads 30, 31 and a connecting line between centers of the two through holes 10, 11. The bent angles c1, c2 or d1, d2 have certain values according to a same kind of placement machine. Usually, c1=c2=45degrees, d1=d2=45degrees. Referring to FIG. 3 and 4, the axial leads 30,31 are bent away or towards the area of the first pads 20, 21 along the connecting line between centers of the two through holes 10, 11. So when layout, a connecting line between a center of the second pad 40 and the center of the through hole 10 and a connecting line between a center of the disk 41 and the center of the through hole 11 should be in alignment with the bending directions of the axial leads 30, 31, respectively. An area of each pair of the first pads 20, 21 and the second pads 40, 41 is big enough to completely receive and place the bent portion of the corresponding axial lead therewithin, for example, a length of a diameter of the second pads 40,41 can be counted according to the following formula:

$$d \geq e - r$$

Wherein d is the diameter of the second pads 40 or 41, e is equal to a length of the axial leads 30, 31 minus a thickness of the printed circuit board, and r is a radius of the first pad 20 or 21.

While a preferred embodiment in accordance with the present invention have been shown and described, equivalent modifications and changes known to persons skilled in the art according to the spirit of the present invention are considered within the scope of the present invention as defined in the appended claims.

What is claimed is:

1. A printed circuit board having improved solder pads to prevent short circuit of the printed circuit board caused by axial leads of components mountable to the printed circuit board engaging with a neighboring circuit of the printed circuit board surrounding the soldering pads, the printed circuit board comprising:
    a pair of through holes for insertion of axial leads of components;
    a pair of first circular pads surrounding corresponding through holes; and
    a pair of second circular pads, each of the second circular pads being tangent to a corresponding first circuit pad, and used to receive a bent portion of a corresponding axial lead of the components therewithin when the bent portion passes through the corresponding first circuit pad.

2. The printed circuit board as described in claim 1, wherein there are no connecting traces passing between the first pads and the second pads.

3. The printed circuit board as described in claim 1, wherein an angle between a first imaginary line connecting a center of one of the second circular pads and a center of the corresponding first circuit pad and a second imaginary line connecting centers of two neighboring ones of the first circular pads is same as an bent angle of the bent portion of the axial leads of the components relative to the second imaginary line.

4. The printed circuit board as described in claim 3, wherein the bent portion of each of the axial leads falls completely within the corresponding first and the second pads.

5. The printed circuit board as described in claim 1, wherein the printed circuit board is a single-layer board.

6. A printed circuit board having improved solder pads to prevent short circuit of the printed circuit board caused by axial leads of components mountable to the printed circuit board engaging with a neighboring circuit of the printed circuit board surrounding the soldering pads, the printed circuit board comprising:
    a pair of through holes;
    a pair of first pads surrounding corresponding through holes respectively; and
    a pair of second pads directly connected to corresponding ones of the pair of first pads, respectively;
    wherein when axial leads of components mountable to the printed circuit board are inserted into the through holes of the printed circuit board, bent portions of the axial leads extending out of corresponding ones of the first pads surrounding the through holes place completely in corresponding areas of the second pads.

7. The printed circuit board as described in claim 6, wherein there are no connecting traces passing between the first pads and the second pad.

8. The printed circuit board as described in claim 6, wherein the first pads are circular.

9. The printed circuit board as described in claim 8, wherein the second pads are circular.

10. The printed circuit board as described in claim 9, wherein the first pads and the corresponding second pads are tangent to each other, respectively.

11. The printed circuit board as described in claim 10, wherein an angle between a first imaginary line connecting a center of one of the first pads and a center of the corresponding second pad and a second imaginary line connecting centers of two neighboring ones of the first pads is same as an bent angle of the bent portions of the axial leads of the components relative to the second imaginary line.

12. The printed circuit board as described in claim 11, wherein each of the pair of first pads is tangent to the corresponding one of the pair of second pads.

13. The printed circuit board as described in claim 6, wherein the printed circuit board is a single-layer board.

14. A method for solderable attachment of an electrically conductive lead of a component to a circuit board to prevent from happening of circuit-shorts, comprising the steps of:
    placing an electrically conductive lead of a component on a circuit board;
    providing a solderable first pad on said circuit board corresponding to said lead along an extending direction of said lead; and
    forming a solderable second pad on said circuit board independent from said first pad to allow placement and soldering of said lead on said circuit board via said first and second pads commonly and exclusively.

15. The method as described in claim 14, wherein said first and second pads are formed tangent to each other.

16. The meted as described in claim 14, further comprising the step of placing said lead in a through hole formed in said circuit board and extending from a center of said first pad.

* * * * *